United States Patent
Sun et al.

(10) Patent No.: US 10,079,180 B1
(45) Date of Patent: Sep. 18, 2018

(54) METHOD OF FORMING A SEMICONDUCTOR DEVICE

(71) Applicant: UNITED MICROELECTRONICS CORP., Hsin-Chu (TW)

(72) Inventors: Yat-Kai Sun, Hsinchu (TW); Chao-Nan Chen, Tainan (TW); Hung-Lin Shih, Hsinchu (TW); Che-Hung Huang, Hsinchu (TW); Wei-Lun Hsu, Taichung (TW); Cheng-Chia Liu, Kaohsiung (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/458,038

(22) Filed: Mar. 14, 2017

(51) Int. Cl.
| | |
|---|---|
| *H01L 21/76* | (2006.01) |
| *H01L 21/8234* | (2006.01) |
| *H01L 21/02* | (2006.01) |
| *H01L 21/3115* | (2006.01) |
| *H01L 21/311* | (2006.01) |
| *H01L 21/3213* | (2006.01) |
| *H01L 21/033* | (2006.01) |
| *H01L 21/308* | (2006.01) |
| *H01L 29/66* | (2006.01) |

(52) U.S. Cl.
CPC .. *H01L 21/823431* (2013.01); *H01L 21/0223* (2013.01); *H01L 21/02247* (2013.01); *H01L 21/0337* (2013.01); *H01L 21/3086* (2013.01); *H01L 21/31144* (2013.01); *H01L 21/31155* (2013.01); *H01L 21/32139* (2013.01); *H01L 29/6653* (2013.01); *H01L 29/6656* (2013.01)

(58) Field of Classification Search
CPC ......... H01L 21/823431; H01L 21/0223; H01L 21/02247; H01L 21/0337; H01L 21/3086; H01L 21/31144; H01L 21/31155; H01L 21/32139; H01L 29/6653; H01L 29/6656
See application file for complete search history.

(56) References Cited

U.S. PATENT DOCUMENTS

| | | | |
|---|---|---|---|
| 8,288,083 B2 | 10/2012 | Zhang et al. | |
| 9,385,218 B1* | 7/2016 | Cheng | H01L 29/66795 |
| 2015/0279974 A1* | 10/2015 | Godet | H01L 29/66803 438/283 |
| 2016/0079248 A1* | 3/2016 | Basker | H01L 29/0692 257/347 |
| 2018/0006138 A1* | 1/2018 | Cheng | H01L 29/66795 |

* cited by examiner

*Primary Examiner* — Victor A Mandala
*Assistant Examiner* — Colleen E Snow
(74) *Attorney, Agent, or Firm* — Winston Hsu

(57) ABSTRACT

A method of forming a semiconductor device includes following steps. First of all, plural mandrel patterns are formed on a target layer. Then, plural capping layers are formed to cover a top region and sidewalls of each of the mandrel patterns, respectively. Next, plural spacers are formed at two sides of each of the capping layers, respectively. Following these, a portion of the spacers and the capping layers covered on the top regions of the mandrel patterns are simultaneously removed, and the capping layers is then removed completely.

19 Claims, 4 Drawing Sheets

METHOD OF FORMING A
SEMICONDUCTOR DEVICE

BACKGROUND OF THE INVENTION

1. Field of the Invention

The present invention relates to a method of forming a semiconductor device, and more particularly to a method of forming a semiconductor device having fin structures.

2. Description of the Prior Art

With increasing miniaturization of semiconductor devices, various multi-gate MOSFET devices have been developed. The multi-gate MOSFET is advantageous for the following reasons. First of all, the fabrication of the multi-gate MOSFET devices is allowable to be integrated into traditional logic device processes, and thus is more compatible. In addition, since the three-dimensional structure of the multi-gate MOSFET increases the overlapping area between the gate and the substrate, the channel region is controlled more effectively, thereby reducing both the drain-induced barrier lowering (DIBL) effect and the short channel effect. Moreover, as the channel region is longer for the same gate length, the current between the source and the drain is increased.

A multi-gate MOSFET has a gate formed on fin-shaped structures, wherein the fin-shaped structures is formed generally through a pattern transfer technique, such as the sidewall image transfer (SIT) process. However, with the demands of miniaturizing the semiconductor devices, the width of each fin-shaped structure, as well as the spacing therebetween both shrinks dramatically. Thus, forming fin-shaped structures which can achieve the required demands under the restrictions of miniaturization, physical limitations and various processing parameters becomes an extreme challenge.

SUMMARY OF THE INVENTION

It is one of the primary objectives of the present invention to provide a method using spacer self-aligned quartic-patterning (SAQP) technique transferring patterns to form fin structures, in which, only one layer of spacer is formed and used as a mask. That is, finer fin structures in the same layout are allowed to be formed through an easier and more efficient strategy.

To achieve the purpose described above, the present invention provides a method of forming a semiconductor device including following steps. First of all, a plurality of mandrel patterns is formed on a target layer. Then, a plurality of capping layers is formed to cover a top region and sidewalls of each of the mandrel patterns, respectively. Next, a plurality of spacers is formed at two sides of each of the capping layers, respectively. Following these, a portion of the spacers and the capping layers covered on the top regions of the mandrel patterns are simultaneously removed, and the capping layers is then completely removed.

Through the present invention, a method using spacer self-aligned quartic-patterning (SAQP) technique transferring patterns to form a semiconductor device having fin structures is provided. According to the present method of forming the semiconductor device, plural capping layers are firstly formed on the top region and the two sidewalls of each mandrel patterns by consuming a part of the mandrel patterns, for example through an oxidation process, a nitridation process, an implantation process or a SEG process, to leave the mandrel patterns with a smaller dimension remained and encompassed by the capping layer. Then, plural spacers are formed at two sides of the capping layer. After trimming the capping layers and the spacers into rectangular shape, the rectangular capping layers are removed, to leave the spacers and the mandrels as a mask to patterning the fin structures. In this way, the fin structures are allowed to be formed in about ⅓ pitch, in comparison with the pitch of the primary mandrel patterns, to gain the semiconductor device in more precise layout.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic diagrams illustrating a method of forming a semiconductor device according to a preferred embodiment of the present invention, wherein:

FIG. 1 illustrates a cross-sectional view of a semiconductor device in the beginning of the forming method;

FIG. 2 illustrates a cross-sectional view of a semiconductor device after forming a capping layer;

FIG. 3 illustrates a cross-sectional view of a semiconductor device after forming a material layer;

FIG. 4 illustrates a cross-sectional view of a semiconductor device after forming a spacer;

FIG. 5 illustrates a cross-sectional view of a semiconductor device after forming a sacrificial layer;

FIG. 6 illustrates a cross-sectional view of a semiconductor device after performing a planarization process;

FIG. 7 illustrates a cross-sectional view of a semiconductor device after removing the capping layer and the sacrificial layer; and FIG. 8 illustrates a cross-sectional view of a semiconductor device after forming fin structures.

DETAILED DESCRIPTION

Figure 1:
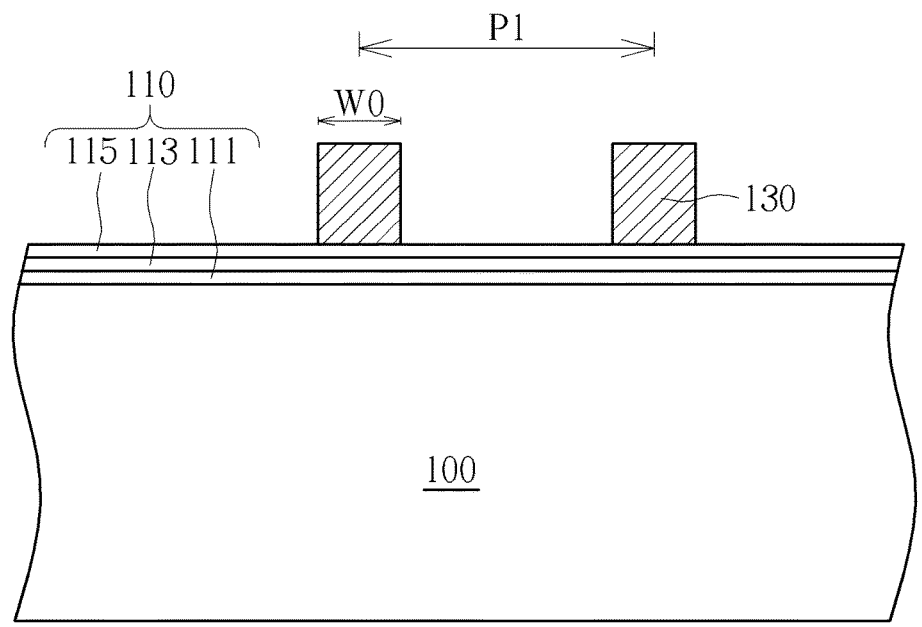

To provide a better understanding of the present invention, preferred embodiments will be described in detail. The preferred embodiments of the present invention are illustrated in the accompanying drawings with numbered elements.

Please refer to FIGS. 1-8, a forming method of a semiconductor device in accordance with the preferred embodiment of the present invention is shown. Firstly, a target layer such as a semiconductor substrate 100 is provided, the semiconductor substrate 100 for example includes a silicon substrate, a silicon containing substrate such as a SiGe substrate or a SiC substrate, or a silicon on insulator (SOI) substrate. However, in another embodiment, the target layer may also include a conductive layer (not shown in the drawings), a dielectric layer or other non-semiconductor materials (not shown in the drawings).

Furthermore, a mask layer 110 is formed over the semiconductor substrate 100. In the present embodiment, the mask layer 110 preferably includes a multilayer structure, for example including a first layer 111 such as an oxide layer, a second layer 113 such as a silicon nitride layer, and a third layer 115 such as another oxide layer, stacked one over another on the semiconductor substrate 100, but is not limited thereto.

Then, a plurality of mandrel patterns 130 is formed on the mask layer 110, as shown in FIG. 1, and the mandrel patterns 130 preferably have same width W0 and the same pitch P1. In the present embodiment, it is exemplified by forming two mandrel patterns 130, with each of the mandrel patterns 130 being spaced from on another by the pitch P1. However, it should be known by one skilled in the arts, the practical number of the mandrel patterns 130 is not limited to the above-described, and may include more mandrel patterns in various arrangements.

Figure 2:
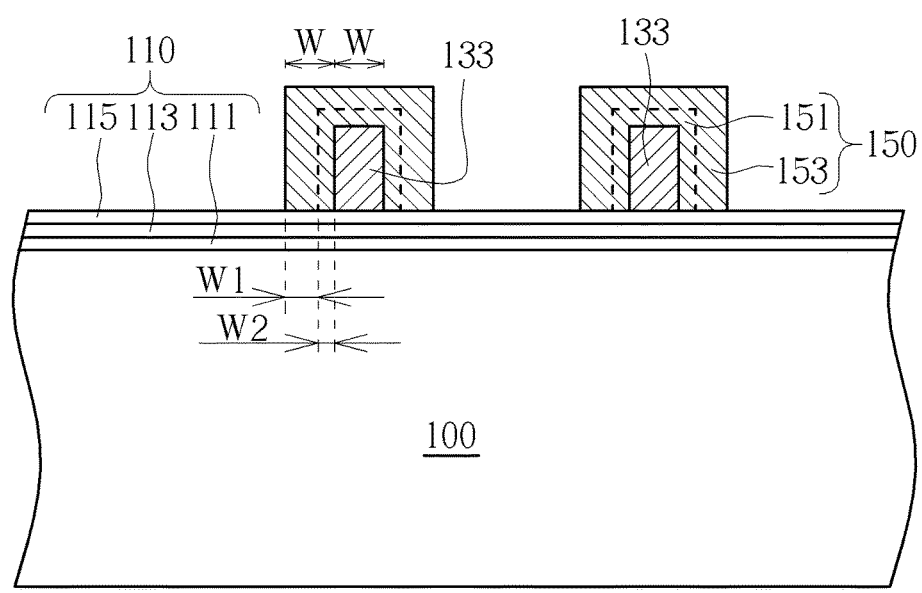

As shown in FIG. 2, a plurality of capping layer 150 is formed on each mandrel patterns 130 respectively, with each capping layer 150 in a reverse U-shape covering the top region and two sidewalls of each mandrel pattern 130. Preferably, the capping layers 150 include a material having an etching selectivity related to the mandrel patterns 130. In one embodiment, the capping layers 150 are formed by consuming an external part (including the top region and the two sidewalls) of each mandrel pattern 130, as shown in FIG. 2. That is, each capping layer 150 formed accordingly may include a portion 151 which is transformed from the external part and is overlapped with the mandrel pattern 130, and another portion 153 which is not overlapped with the mandrel patterns 130. On the other hand, the non-consumed part of each the mandrel patterns 130 are remained on the mask layer 110, thereto become mandrel patterns 133 in a relative smaller dimension and a smaller height. The mandrel patterns 133 are namely encompassed by the capping layers 150. In the present embodiment, the mandrel patterns 133 preferably include the same width W as the width W of the capping layers 150, but is not limited thereto.

It is noted that, the forming process of the capping layers 150 may be diverse by the material of the mandrel patters 130. For example, the mandrel patters 130 of the present invention includes silicon, so that, the formation of the capping layers 150 may be accomplished by an oxidation process. In this way, the capping layers 150 may include silicon dioxide ($SiO_2$), and a ratio between a width W1 of the non-overlapped portion 153 and a width W2 of the overlapped portion 151 is about 3:2, and a ratio between the width W2 of the non-overlapped portion 151 and the entire width W of the capping layers 150 is about 1:2.2, but is not limited thereto.

In another embodiment, the formation of the capping layers may be also be accomplished through an implantation process, or a selective epitaxial growing (SEG) process, thereto form capping layers (not shown in the drawings) with an implanted dopant such as C, P or Ge, or to form doped epitaxial capping layers (not shown in the drawings). Through these embodiments, the capping layers may also have etching selectivity related to the mandrel patterns, and however, the ratio between the widths of the overlapped portion and the non-overlapped portion of the capping layer may be divers by the materials thereof. Moreover, in another embodiment, the mandrel patters 130 may also include other material, such as oxide, and the capping layers are then formed through a nitridation process, thereto obtain the capping layers including SiN or SiON. However, people in the art shall easily realize the capping layers of the present invention are not limited to being formed by consuming a part of the mandrel patterns 130, and in some embodiment, capping layers (not shown in the drawings) may also be directly formed on surfaces of the mandrel patterns 130 respectively, for example, utilizing a SEG process to form epitaxial capping layers of SiGe or SiC.

Figure 3:
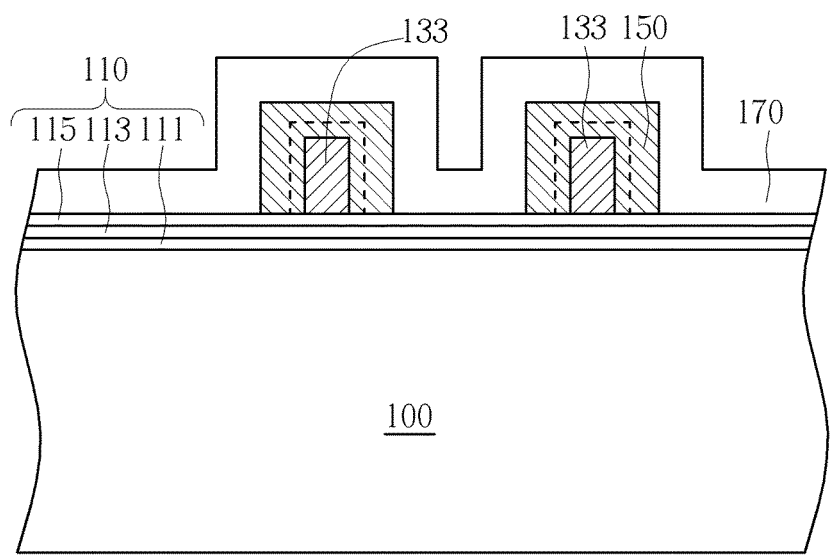
Figure 4:
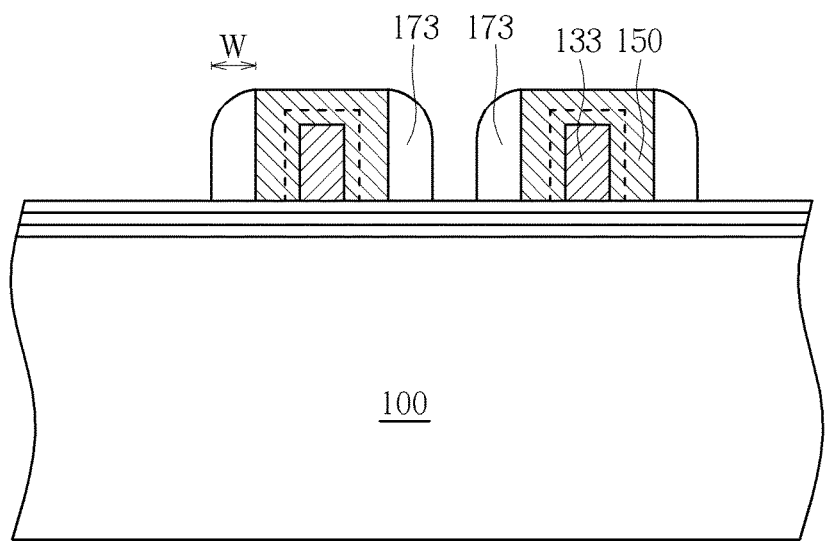

Next, a plurality of spacers 173 is formed at two sides of each capping layer 150. As shown in FIG. 3, a material layer 170, preferably including a material having etching selectivity related to that of the capping layers 150, such as SiN or SiCN, is firstly formed to cover the mask layer 110, the capping layers 150, and the mandrel patterns 133. Then, an etching back process is performed to remove a portion of the material layer 170, so that, the top surface of the mask layer 110, as well as the top surfaces of the capping layers 150 may exposed from the material layer 170, as shown in FIG. 4. That is, spacer 173 having an arc-shaped sidewall are formed to surround the capping layers 150 and the mandrel patterns 133, as shown in FIG. 4. In one embodiment, the spacers 173 preferably include the same width W as that of the mandrel patterns 130 and the capping layer 150, but is not limited thereto.

Figure 5:
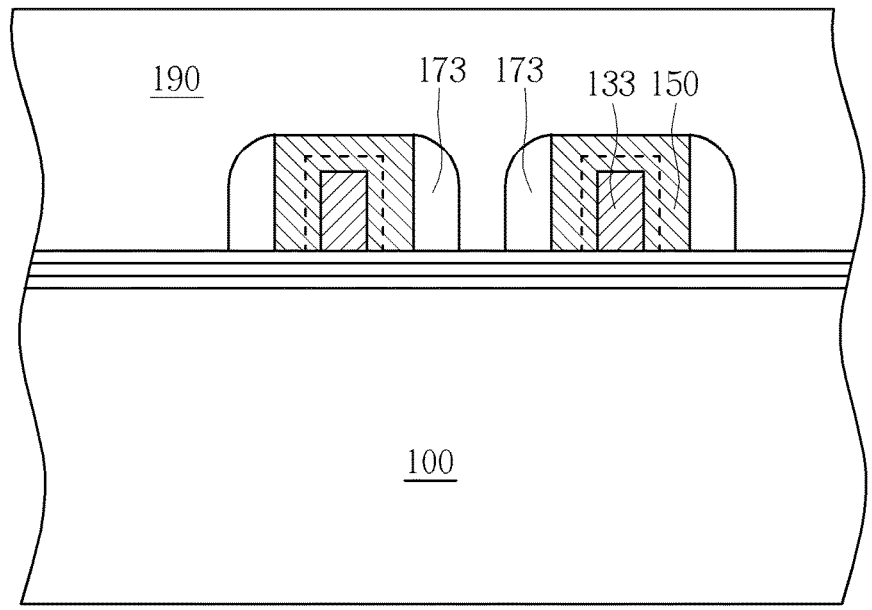
Figure 6:
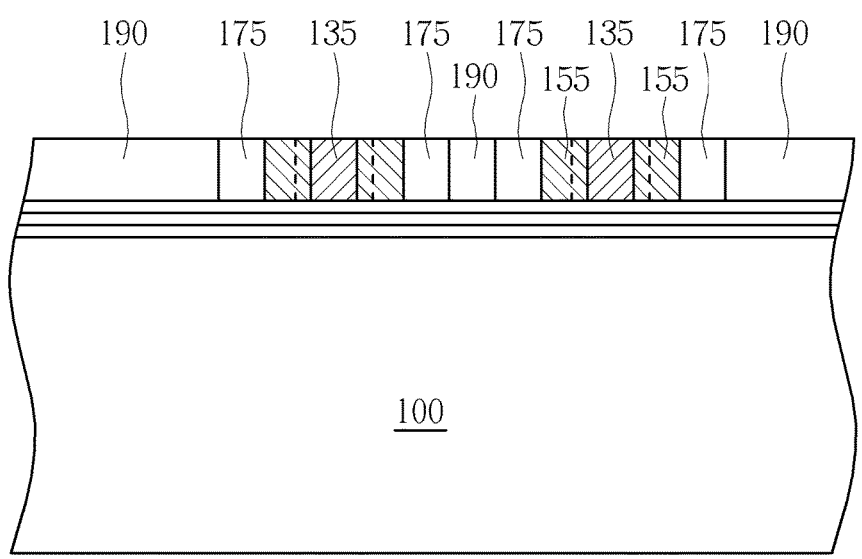

Following these, an appropriate planarization process, such as a chemical mechanical polish (CMP) process, is performed to partially remove the spacers 173 and the capping layers 150. In the present embodiment, the planarization process is carried out through firstly forming a sacrificial layer 190 as shown in FIG. 5, to entirely cover the spacers 173, the capping layers 150 and the mask layer 110, and then, simultaneously removing a portion of the spacers 173 and the capping layers 150 by using the CMP process. That is, the arched sidewalls of the spacers 173, as well as the capping layer 150 covered on the mandrel patterns 133, are both removed, to expose the mandrel patterns 133 underneath. The exposed mandrel patterns 133 are then partially removed while further removing the spacers 173 and the capping layers 150, till forming a plurality of spacers 175, capping layers 155 and mandrels 135 both in rectangular shape, as shown in FIG. 6. It is noted that, the capping layers 155 are disposed at two sides of the mandrels 135 respectively, and the spacers 175 are disposed at two sides of the capping layers 155 respectively. Then, the sacrificial layer 190 remained on the mask layer 110 are completely removed.

Figure 7:
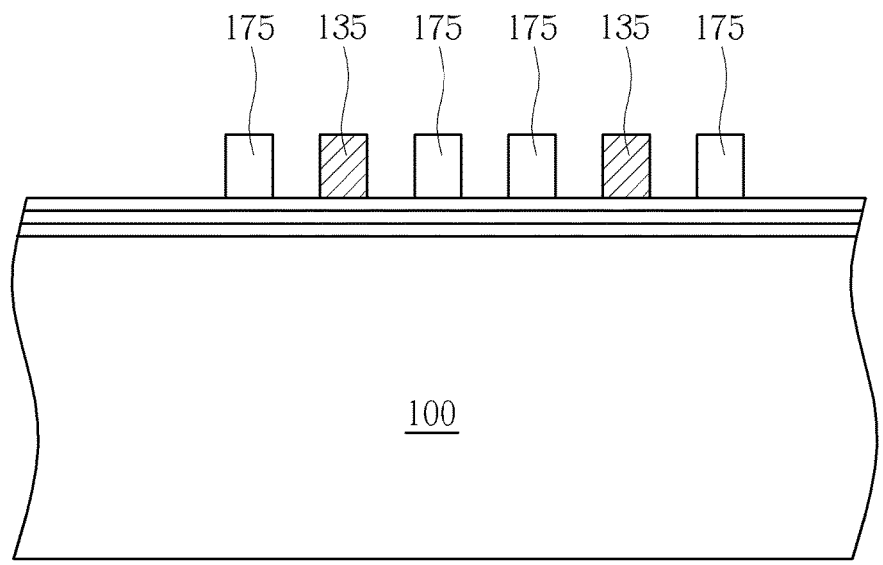

After completely removing the sacrificial layer 190 remained on the mask layer 110, the capping layers 155 are then removed by using the etching selectivity between the mandrels 135, the spacers 175 and the capping layer 155. In this way, only the spacers 175 and the mandrel 135 are remained on the mask layer 110, as shown in FIG. 7, and the spacers 175 and the mandrel 135 may therefore be used as a hard mask in the subsequent process, for forming a plurality of fin structure 101 in the semiconductor substrate 100. However, in the embodiment of forming the capping layers by the oxidation process, the capping layers 155 and the sacrificial layer 190 remained on the mask layer 110 may also be simultaneously removed through the same process.

Figure 8:
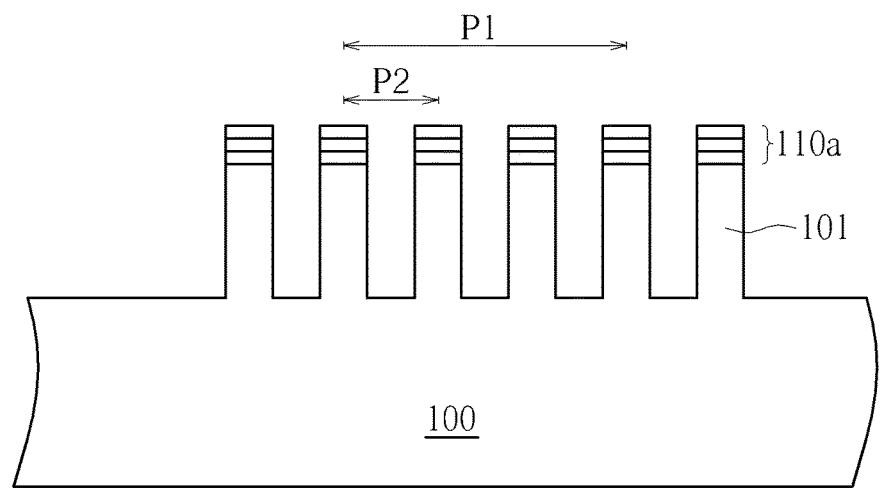

Then, the patterns of the spacers 175 and the mandrel 135 are firstly transferred into the mask layer 110 underneath, and then further transferred into the semiconductor substrate 100, for example through a dry etching, a wet etching process or a sequentially performed dry and wet etching process. That is, the fin structures 101 in the same layout as the spacers 175 and the mandrels 135 are formed in the semiconductor substrate, as shown in FIG. 8. It is noted that, the fin structures 101 have a pitch P2, which is about ⅓ times smaller than the pitch P1 of the primary formed mandrel patterns 130.

In view of the above mentioned steps, a method of forming the semiconductor device according to the preferred embodiment of the present invention is accomplished. After that, the patterned mask layer 110a may be at least partially removed while forming a shallow trench isolation (STI, not shown in the drawings) region surrounded the fin structures 101, and then, a gate structure (not shown in the drawings)

is then formed to cross the fin structure 101, thereby forming a due-gate or tri-gate structure based on the practical requirements in the present embodiment. Otherwise, in the other embodiment of having the dielectric layer or the conductive layer as the target layer, the spacers 175 and the mandrels 135 may also be used as mask to form a plurality of contact openings (not shown in the drawings), or a plurality of metal wires in a semiconductor device, but is not limited thereto.

Overall, the present invention provides a method using spacer self-aligned quartic-patterning (SAQP) technique transferring patterns to form a semiconductor device having fin structures. According to the present method of forming the semiconductor device, plural capping layers are firstly formed on the top region and the two sidewalls of each mandrel patterns by consuming a part of the mandrel patterns, for example through an oxidation process, a nitridation process, an implantation process or a SEG process, to leave the mandrel patterns with a smaller dimension remained and encompassed by the capping layer. Then, plural spacers are formed at two sides of the capping layer. After trimming the capping layers and the spacers into rectangular shape, the rectangular capping layers are removed, to leave the spacers and the mandrels as a mask to patterning the fin structures. In this way, the fin structures are allowed to be formed in about ⅓ pitch, in comparison with the pitch of the primary mandrel patterns, to gain the semiconductor device in more precise layout.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
    forming a plurality of mandrel patterns on a target layer;
    forming a plurality of capping layers covering a top region and sidewalls of each of the mandrel patterns, respectively, wherein each of the capping layers and each of the mandrel patterns covered by each of the capping layers are spaced from each other;
    forming a plurality of spacers, at two sides of each of the capping layers, respectively;
    after forming the spacers, simultaneously removing a portion of the spacers and the capping layers covering on the top regions of the mandrel patterns; and
    completely removing the capping layers.

2. The method of forming a semiconductor device of claim 1, wherein each of the capping layers is formed in a reverse U-shape.

3. The method of forming a semiconductor device of claim 1, wherein the forming of the capping layers comprises:
    oxidizing the sidewalls and the top region of each of the mandrel patterns to form the capping layers.

4. The method of forming a semiconductor device of claim 1, wherein the forming of the capping layers comprises:
    nitriding the sidewalls and the top region of each of the mandrel patterns to form the capping layers.

5. The method of forming a semiconductor device of claim 1, wherein the forming of the capping layers comprises:
    implanting a dopant into the sidewalls and the top region of each of the mandrel patterns to form the capping layers.

6. The method of forming a semiconductor device of claim 1, wherein the forming of the capping layers comprises:
    selectively forming an epitaxial layer on the sidewalls and the top region of each of the mandrel patterns to form the capping layers.

7. The method of forming a semiconductor device of claim 1, wherein the forming of the capping layers comprises:
    consuming the sidewalls and the top regions of each of the mandrel patterns to form a portion of the capping layers.

8. The method of forming a semiconductor device of claim 1, wherein after completely removing the capping layers, the spacers and a plurality of mandrels remain on the target layer.

9. The method of forming a semiconductor device of claim 8, further comprising:
    patterning the target layer by using the spacers and the mandrels as a mask.

10. The method of forming a semiconductor device of claim 8, wherein each of the spacers has a width being equal to a width of the mandrels.

11. The method of forming a semiconductor device of claim 8, wherein the capping layers have an etching selectivity related to the mandrels and the spacers.

12. The method of forming a semiconductor device of claim 1, wherein each of the capping layers comprises a portion overlapped with the mandrel patterns, and another portion non-overlapped with the mandrel patterns.

13. The method of forming a semiconductor device of claim 12, wherein a width of the portion overlapped with the mandrel patterns related to a width of the portion overlapped with the mandrel patterns and the portion non-overlapped with the mandrel patterns is about 1:2.2.

14. The method of forming a semiconductor device of claim 12, wherein a width of the portion overlapped with the mandrel patterns related to a width of the portion non-overlapped with the mandrel patterns is about 2:3.

15. The method of forming a semiconductor device of claim 1, further comprising:
    forming a sacrificial layer covering the spacers, the capping layers and the mandrel patterns, before removing the spacers and the capping layers.

16. The method of forming a semiconductor device of claim 15, further comprising:
    completely removing the sacrificial layer, after removing the spacers and the capping layers.

17. The method of forming a semiconductor device of claim 1, further comprising:
    forming a mask layer on the target layer.

18. The method of forming a semiconductor device of claim 1, wherein the target layer comprises a conductive layer, a dielectric layer or a semiconductor layer.

19. A method of forming a semiconductor device, comprising:
    forming a plurality of mandrel patterns on a target layer;
    forming a plurality of capping layers covering a top region and sidewalls of each of the mandrel patterns, respectively;
    forming a plurality of spacers, at two sides of each of the capping layers, respectively;
    forming a sacrificial layer covering the spacers, the capping layers and the mandrel patterns;

after forming the sacrificial layer, removing a portion of the spacers and the capping layers covering on the top regions of the mandrel patterns; and completely removing the capping layers.

\* \* \* \* \*